United States Patent
Drake et al.

(10) Patent No.: US 11,379,020 B2
(45) Date of Patent: Jul. 5, 2022

(54) LIQUID COOLED MEMORY MODULE SERVICE DEVICE FOR SYSTEMS WITH MULTIPLE MEMORY MODULE THICKNESSES AND METHODS OF USING THE SAME

(71) Applicant: Lenovo Enterprise Solutions (Singapore) Pte. Ltd., New Tech Park (SG)

(72) Inventors: Jim Drake, Raleigh, NC (US); Jeffrey Holland, Raleigh, NC (US); Leo Webster, Raleigh, NC (US); James Womble, Raleigh, NC (US)

(73) Assignee: Lenovo Enterprise Solutions (Singapore) Ptd. Ltd., New Tech Park (SG)

( * ) Notice: Subject to any disclaimer, the term of this patent is extended or adjusted under 35 U.S.C. 154(b) by 641 days.

(21) Appl. No.: 16/457,230

(22) Filed: Jun. 28, 2019

(65) Prior Publication Data
US 2020/0409435 A1    Dec. 31, 2020

(51) Int. Cl.
*G06F 1/20*     (2006.01)
*H05K 7/20*     (2006.01)

(52) U.S. Cl.
CPC ......... *G06F 1/203* (2013.01); *H05K 7/20218* (2013.01); *G06F 2200/201* (2013.01)

(58) Field of Classification Search
CPC ........... H05K 13/0007; H05K 13/0015; H05K 7/20218; H05K 7/2049; G06F 1/203; G06F 2200/201; G06F 1/185; G06F 1/20
See application file for complete search history.

(56) References Cited

U.S. PATENT DOCUMENTS 3,516,142 A * 6/1970 Mottl ................ H05K 13/0007
                                                    29/758
4,868,975 A * 9/1989 Zaremba ............ H05K 13/0491
                                                    29/758
(Continued)

*Primary Examiner* — Abhishek M Rathod
(74) *Attorney, Agent, or Firm* — Olive Law Group, PLLC

(57) ABSTRACT

Devices and methods for adjusting the position of liquid cooling system infrastructure of a computing system comprising liquid-cooled memory modules to provide improved systems and techniques for servicing liquid-cooled memory modules are disclosed herein. According to an aspect, a device includes a table section, a handle on a first side of the table section, and a spreader section on a second side of the table section opposite from the first side, the spreader section further comprising a profile. The profile of the spreader section comprises a first pair of a flat surfaces parallel to each other, defining a first width. The profile of the spreader section further comprises a second pair of flat surfaces parallel to each other, defining a second width perpendicular to the first width, the second width being longer than the first width. The profile of the spreader section also comprises a pair of curved transition sections on opposite corners of the profile, each transition section configured to controlled adjustment with progressive incremental radius increments between an adjacent surface from each of the first pair and second pair of surfaces, such that the device is adapted to insertion with respect to a gap between cooling elements of a double-sided memory module cooling system, and is configured to be rotated to adjust the position of the cooling elements.

7 Claims, 7 Drawing Sheets

(56) References Cited

U.S. PATENT DOCUMENTS

| | | | | |
|---|---|---|---|---|
| 5,365,653 | A * | 11/1994 | Padrun | H05K 13/0491 |
| | | | | 29/764 |
| 7,663,883 | B2 * | 2/2010 | Shirakami | H01L 23/373 |
| | | | | 174/15.2 |
| 7,916,485 | B2 * | 3/2011 | Yu | H01L 23/433 |
| | | | | 361/710 |
| 7,969,736 | B1 * | 6/2011 | Iyengar | H01L 23/4338 |
| | | | | 174/15.1 |
| 8,493,738 | B2 * | 7/2013 | Chainer | H05K 7/20781 |
| | | | | 361/699 |
| 9,370,122 | B2 * | 6/2016 | Chainer | G06F 3/044 |
| 10,021,814 | B2 * | 7/2018 | Aoki | H05K 7/20763 |
| 2004/0250989 | A1 * | 12/2004 | Im | H01L 23/4093 |
| | | | | 165/80.1 |
| 2006/0098409 | A1 * | 5/2006 | Cheon | G11B 33/142 |
| | | | | 361/699 |
| 2009/0218087 | A1 * | 9/2009 | Oshima | F28F 13/00 |
| | | | | 252/73 |
| 2011/0225819 | A1 * | 9/2011 | Barina | H05K 13/0491 |
| | | | | 29/832 |
| 2013/0194745 | A1 * | 8/2013 | Meijer | G06F 1/20 |
| | | | | 361/679.47 |
| 2013/0342987 | A1 * | 12/2013 | Yang | H01L 23/473 |
| | | | | 361/679.32 |
| 2020/0159294 | A1 * | 5/2020 | Franz | H01L 21/4882 |

* cited by examiner

LIQUID COOLED MEMORY MODULE SERVICE DEVICE FOR SYSTEMS WITH MULTIPLE MEMORY MODULE THICKNESSES AND METHODS OF USING THE SAME

TECHNICAL FIELD

The presently disclosed subject matter relates generally to service devices for computing systems comprising liquid cooling systems. Particularly, the presently disclosed subject matter relates to devices and methods of servicing components that facilitate servicing liquid cooled memory modules.

BACKGROUND

In liquid cooled servers where maximum heat recovery (heat dissipated by liquid and not air) and ASHRAE W4 water temperatures (45° C. inlet) are used, it is critical to couple as many of the heat producing components to the liquid cooling infrastructure as possible. Memory modules today have power states of over 10 W per module and are a meaningful source of heat to be recovered. Recovering this heat today requires compressive forces to be applied on either a single or both sides of the module or submersing the entire module in an immersion-cooling fluid.

Each cooling infrastructure has disadvantages in either effectiveness and/or serviceability. Fixed systems make accessing components difficult. Immersion systems complicate and delay servicing because of time which must be spent with respect to the open liquid cooling medium. Removable systems require removal of the entire cooling system, in order to take advantage of the additional physical degrees of freedom, compared to a similar fixed system. Single-sided cooling is limited in effectiveness and double-sided cooling systems are crowded for access and are difficult to service. Therefore, there is a need for improved systems and techniques for servicing high power liquid-cooled memory modules.

SUMMARY

The presently disclosed subject matter provides devices and methods for adjusting the position of liquid cooling system infrastructure of a computing system comprising liquid-cooled memory modules to provide improved systems and techniques for servicing liquid-cooled memory modules.

According to an aspect, a device includes a table section, a handle on a first side of the table section, and a spreader section on a second side of the table section opposite from the first side, the spreader section further comprising a profile. The profile of the spreader section comprises a first pair of a flat surfaces parallel to each other, defining a first width. The profile of the spreader section further comprises a second pair of flat surfaces parallel to each other, defining a second width perpendicular to the first width, the second width being longer than the first width. The profile of the spreader section also comprises a pair of curved transition sections on opposite corners of the profile, each transition section configured to controlled adjustment with progressive incremental radius increments between an adjacent surface from each of the first pair and second pair of surfaces, such that the device is adapted to insertion with respect to a gap between cooling elements of a double-sided memory module cooling system, and is configured to be rotated to adjust the position of the cooling elements.

According to another aspect, a method for adjusting the position of cooling elements with respect to a liquid cooling system infrastructure includes steps of providing a device similar to the device described above and inserting and rotating the device.

BRIEF DESCRIPTION OF THE DRAWINGS

Figure 1:
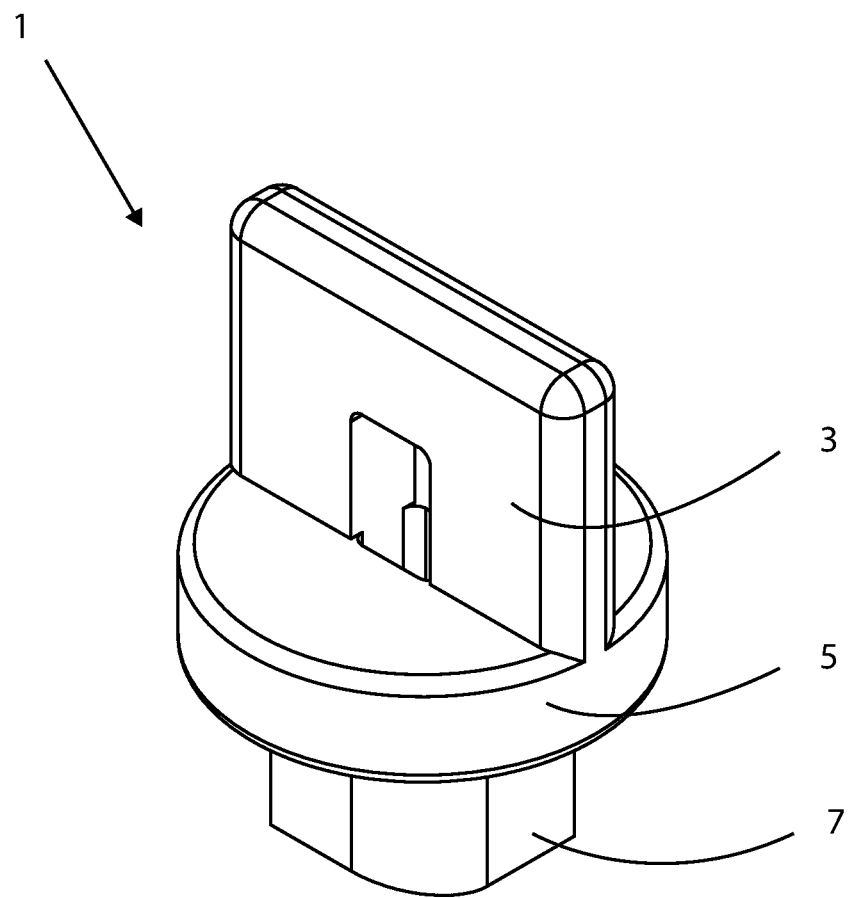
Figure 2A:
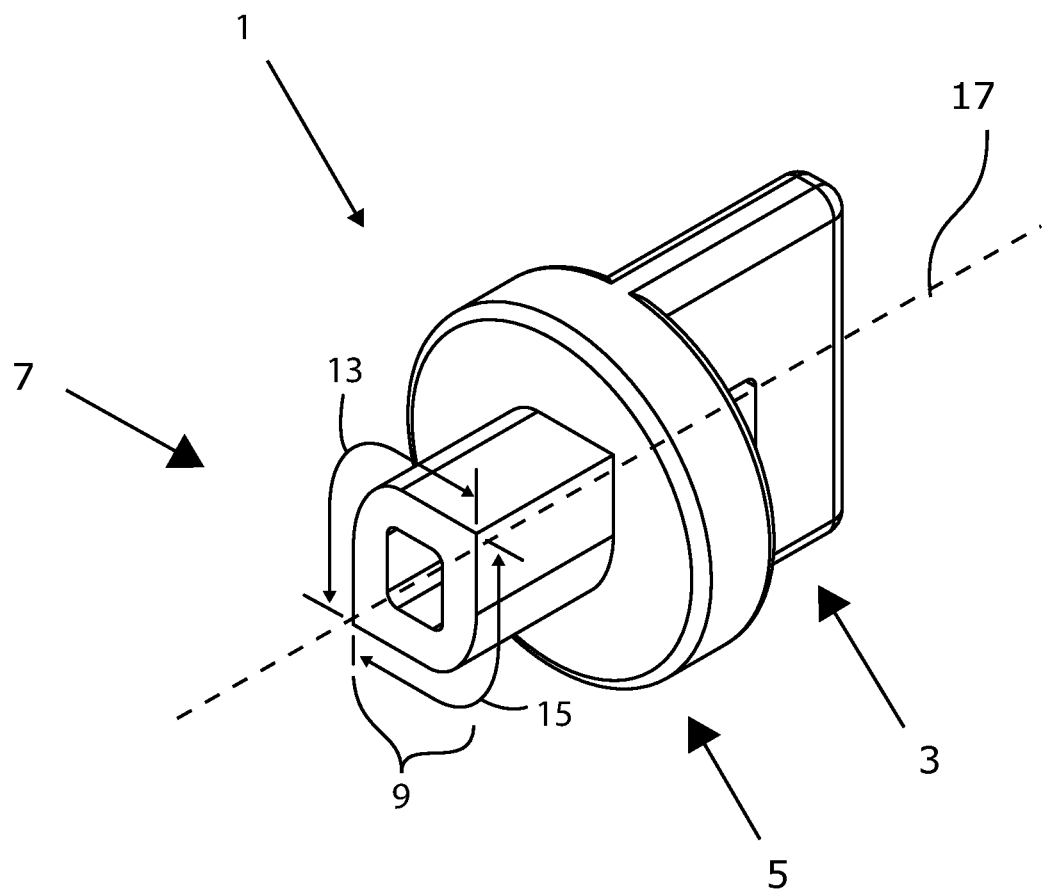
Figure 2B:
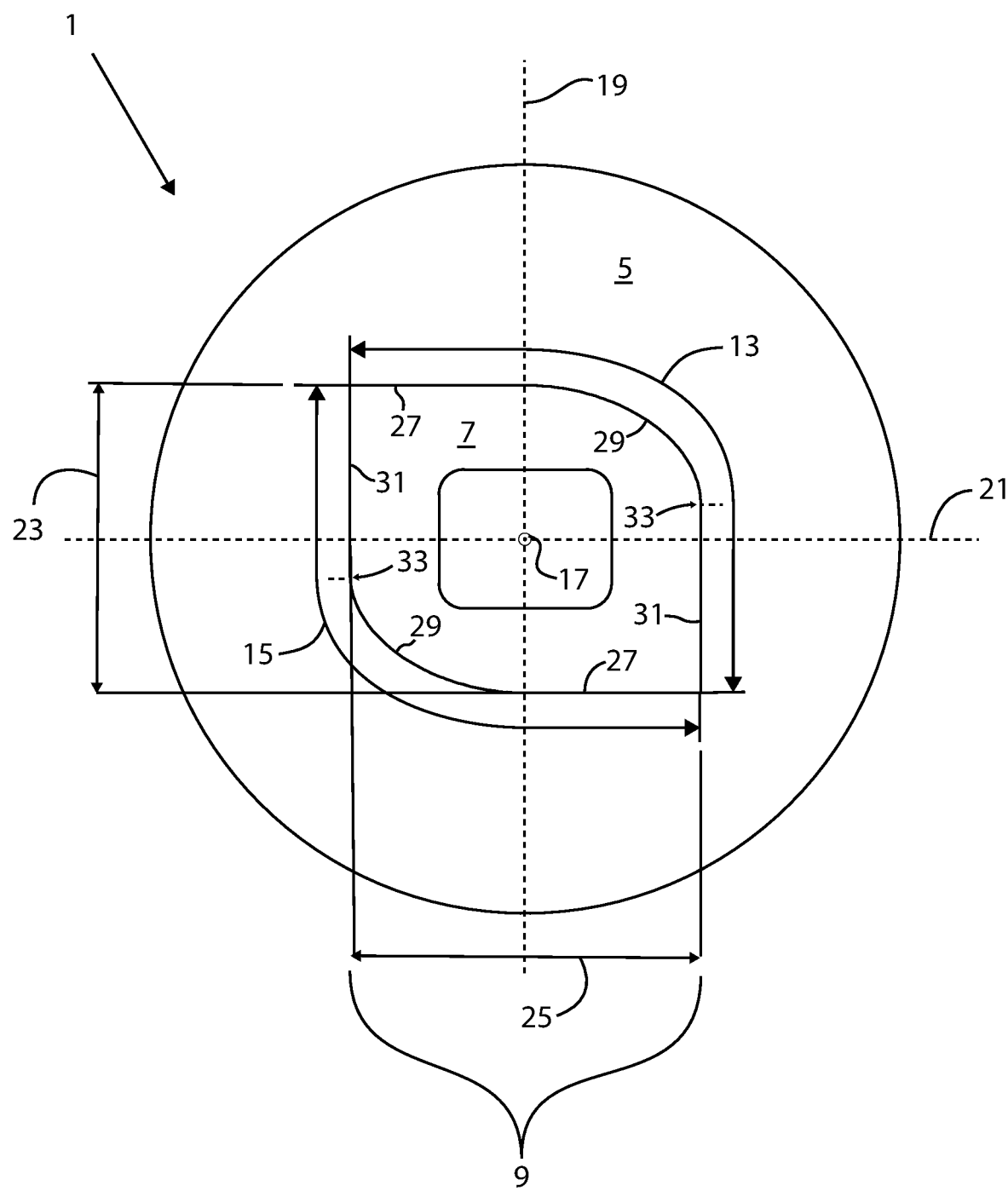
Figure 3:
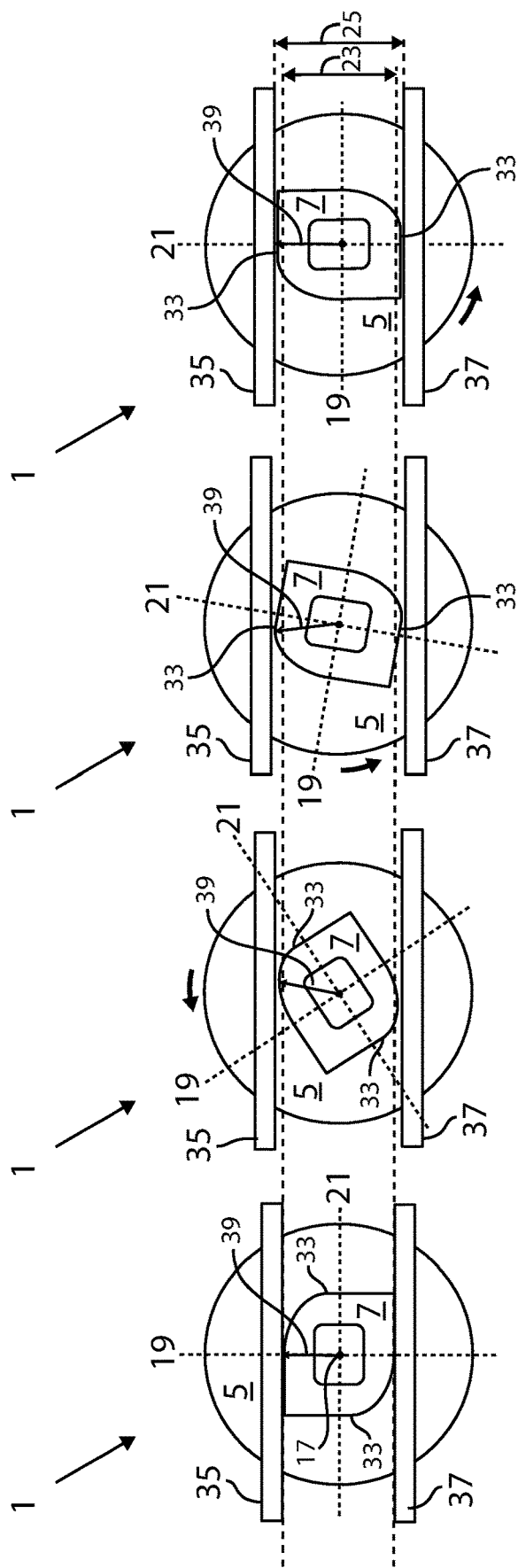
Figure 4:
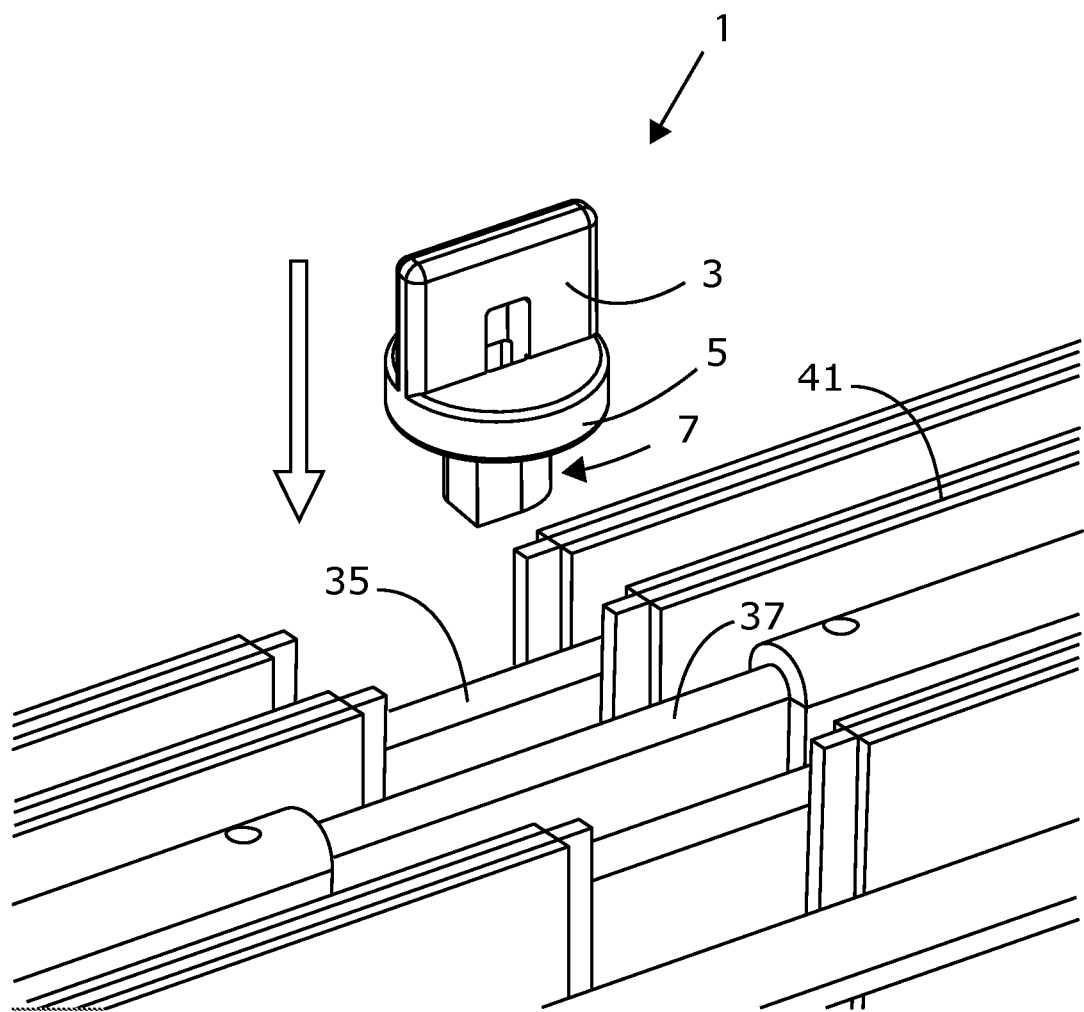
Figure 5:
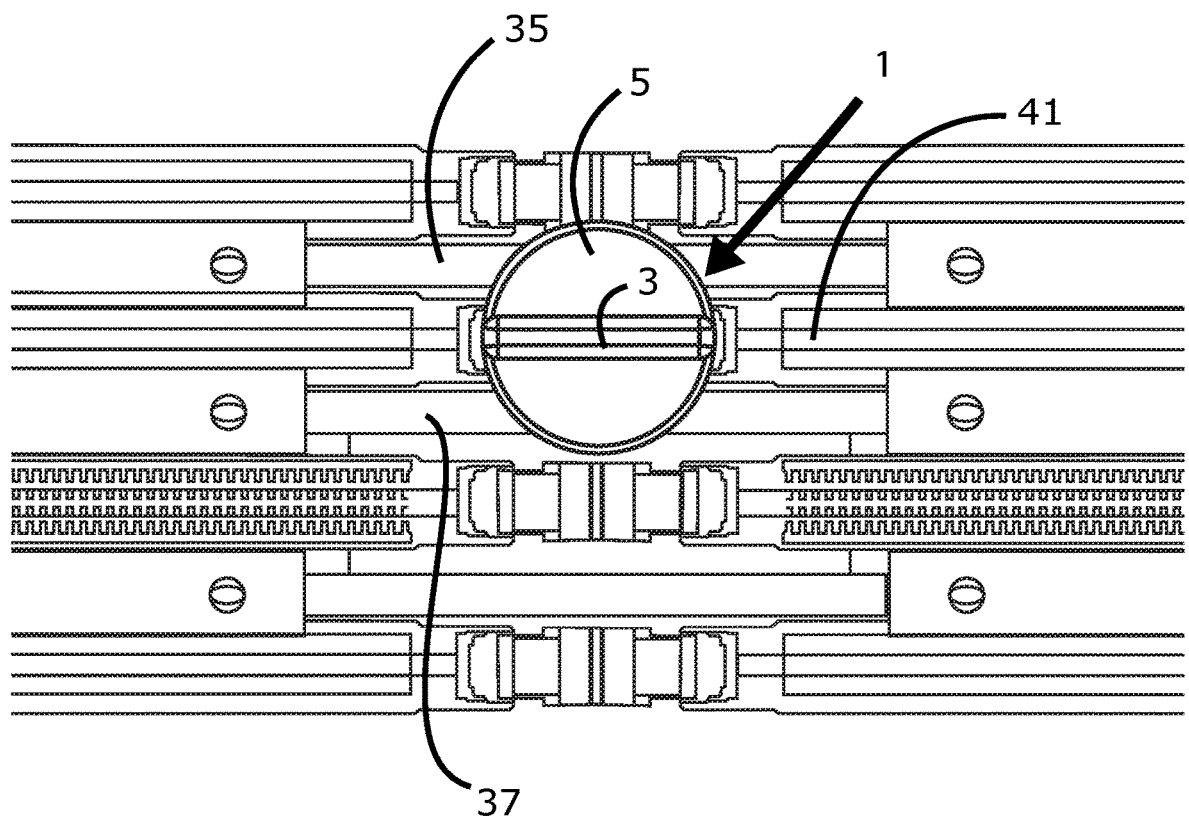
Figure 6:
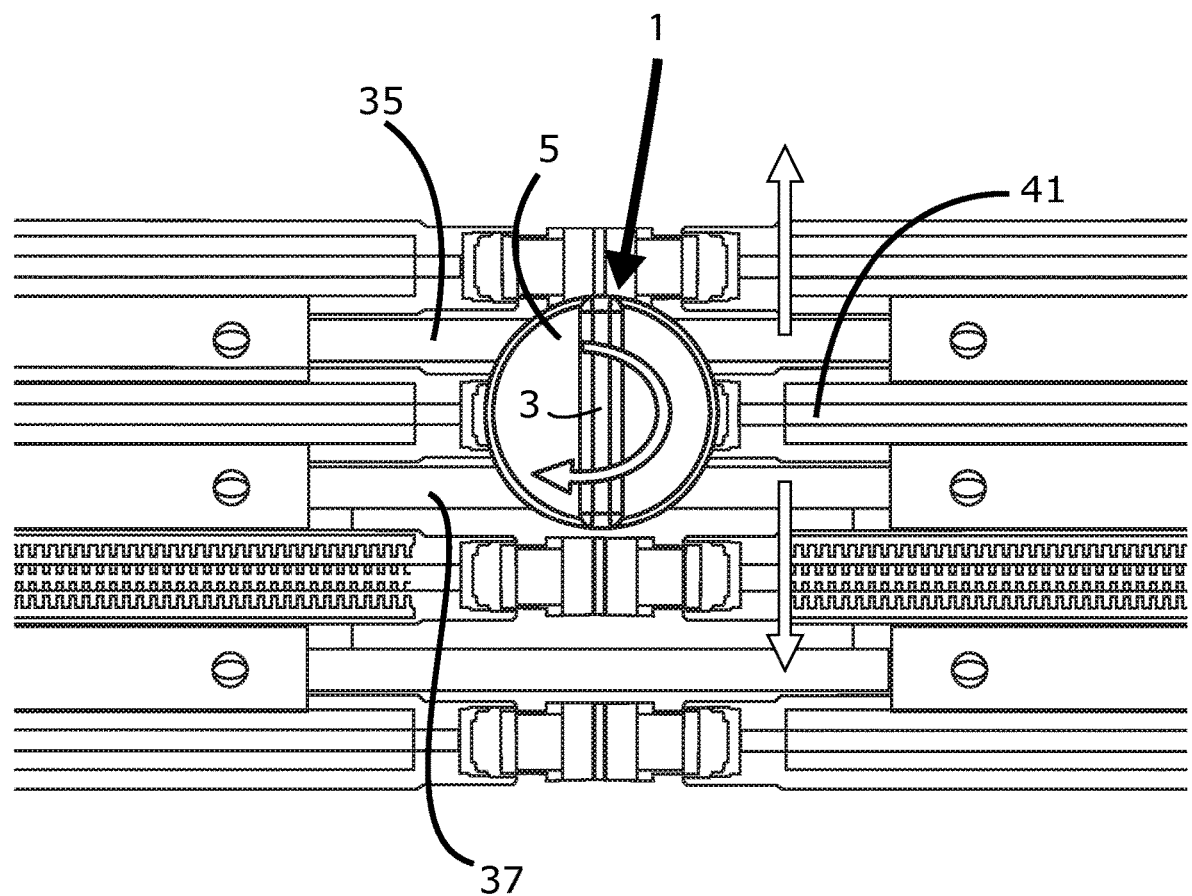

Having thus described the presently disclosed subject matter in general terms, reference will now be made to the accompanying drawings, which are not necessarily drawn to scale, and wherein:

FIG. 1 is a perspective view of a memory service device standing upright in accordance with embodiments of the present disclosure;

FIG. 2A is a bottom perspective view of a memory service device in accordance with embodiments of the present disclosure;

FIG. 2B is a bottom view of a memory service device in accordance with embodiments of the present disclosure;

FIG. 3 is a bottom view of a memory service device, in relative position of adjusting the position of a pair of compressive cooling elements of a memory module in a double-sided memory module cooling system, in accordance with embodiments of the present disclosure;

FIG. 4 is a perspective view of step of a method of insertion of a memory service device into a gap between two compressive cooling elements in accordance with embodiments of the present disclosure;

FIG. 5 is a plan view of a memory service device similar to the device shown in FIG. 4, following a step of insertion into a gap between a pair of compressive cooling elements of a double-sided memory module cooling system, in accordance with embodiments of the present disclosure; and FIG. 6 is a plan view of a step of a method of temporarily adjusting the gap between a pair of compressive cooling elements of a double-sided memory module cooling system, using a memory service device similar to the device shown in FIG. 4, in accordance with embodiments of the present disclosure.

DETAILED DESCRIPTION

The following detailed description is made with reference to the figures. Exemplary embodiments are described to illustrate the disclosure, not to limit its scope, which is defined by the claims. Those of ordinary skill in the art will recognize a number of equivalent variations in the description that follows.

Articles "a" and "an" are used herein to refer to one or to more than one (i.e. at least one) of the grammatical object of the article. By way of example, "an element" means at least one element and can include more than one element.

"About" is used to provide flexibility to a numerical endpoint by providing that a given value may be "slightly above" or "slightly below" the endpoint without affecting the desired result.

The use herein of the terms "including," "comprising," or "having," and variations thereof is meant to encompass the elements listed thereafter and equivalents thereof as well as additional elements. Embodiments recited as "including," "comprising," or "having" certain elements are also contemplated as "consisting essentially of" and "consisting" of those certain elements.

Recitation of ranges of values herein are merely intended to serve as a shorthand method of referring individually to each separate value falling within the range, unless otherwise indicated herein, and each separate value is incorporated into the specification as if it were individually recited herein. For example, if a range is stated as between 1%-50%, it is intended that values such as between 2%-40%, 10%-30%, or 1%-3%, etc. are expressly enumerated in this specification. These are only examples of what is specifically intended, and all possible combinations of numerical values between and including the lowest value and the highest value enumerated are to be considered to be expressly stated in this disclosure.

Unless otherwise defined, all technical terms used herein have the same meaning as commonly understood by one of ordinary skill in the art to which this disclosure belongs.

As referred to herein, the term "computing device" should be broadly construed. It can include any type of device including hardware, software, firmware, the like, and combinations thereof. A computing device may include one or more processors and memory or other suitable non-transitory, computer readable storage medium having computer readable program code for implementing methods in accordance with embodiments of the present disclosure. A computing device may be a server or any other type of computing device. For example, a computing device can be any type of conventional computer such as a laptop computer or a tablet computer.

As used herein, the term "electronic component" refers to any component that operates as part of a computing device. Example electronic components include, but are not limited to, a system board, a processor, a memory device, a dual in-line memory module (DIMM), or the like.

As used herein, the term "memory" or "memory device" is generally a storage device of a computing device. Examples include, but are not limited to, read-only memory (ROM), a dual in-line memory module (DIMM), and random access memory (RAM).

Alternative types of liquid cooling types have their own advantages and disadvantages. For example:

Fixed cooling-loop systems with single-sided memory cooling is an arrangement in which only one side of a memory module is attached directly to cooling infrastructure. By being in contact with heat conducting cooling elements of such a loop on only one side, the memory module can be serviced readily, because there is no obstruction to access on the side which is not in contact with the cooling element. However, cooling a memory module on only one side greatly decreases the performance of the system. High power states of over 10 W per module cannot be adequately cooled with a single-sided warm-water cooling system.

Memory modules can be cooled on both sides with a full immersion cooling system. In these cooling systems, the computing system is immersed in a non-conducting warm oil bath. This is able to maximize the cooling fluid's conductive contact surface area with the computing system, including the memory modules. Without compressive cooling elements against the memory modules, the modules are not obstructed from a user's physical access. However, the servicing advantage of being free from rigid obstructions is mitigated by the ergonomic awkwardness of removing the computing system from the oil, and additional time consumed in preparation for the service. The systems cannot be serviced while they contain any residual fluid, and therefore overall service time for such a system is prolonged by a time delay in which the oil runs off and the system dries completely.

Fixed cooling-loop systems with dual-sided memory cooling provide greater conductive surface area with the memory modules than single sided cooling systems and avoid the mess and time delay of the oil-removal steps of an immersion system. With the greater surface area, they are able to cool high performance memory modules (such as ones with 10 W output) with warm-water (45 degrees C.) cooling. However, to apply the compressive forces necessary to make such efficient double-sided cooling possible, while allowing the modules to be alternately separated from its respective cooling elements, the system requires a greater degree of compliance in the thermal path between the fluid and the conducting surfaces of the modules.

One form of providing compliance is by the thermal path comprising compliant thermal interface material in the thermal path of the system, between the fluid, the heat-conducting material of the cooling element's conduits, and the conducting surfaces of the memory modules. However, even with compliance, these materials effect compressive forces on the memory modules to achieve the conductive thermal performance, and the compressive loads on both sides of the memory module create a sandwich effect that makes removing the memory module difficult.

Removable water-cooling loop systems allow for unobstructed access to memory modules. Such systems improve access over fixed single and fixed double-sided cooling systems by being designed to be removed entirely. In theory, cooling systems that are designed to be removed means physical access and forceful obstructions can be overcome with an additional degree of freedom, beyond the mere pliancy of the modules and the degree to which grippable edges and features of the modules are reachable while installed in proximity to the cooling elements of a fixed system.

However, the reality of these systems comes back to the same limitations of a single-sided and double-sided fixed cooling system, respectively. Respectively, a removable cooling system with single-sided cooling is just as limited in cooling capacity as a fixed system with single-sided cooling, and a removable double-sided cooling system still compresses a memory module on both sides, and therefore the compressive forces effect a friction that prevents separation of the memory module from the compressive elements before either can be removed from one another.

Further, a removable cooling system of either single or double-contact type requires the many additional steps otherwise necessary to free the entire cooling system from the computing system. The complete removability of the cooling system may have worthwhile advantages to some servicing actions, compared to fixed systems, but removing an entire cooling infrastructure is especially tedious for merely servicing memory modules, because of the high failure rate of memory modules.

The present invention provides a solution that alleviates the detriments of a dual-sided memory cooling infrastructure. The invention allows implementation of a system with the heat transfer benefits of double-sided memory cooling and the serviceability benefits of a fixed cooling-loop system by comprising embodiments of a device and methods of use that reduce the compressive forces being applied to the memory module during service actions.

The device allows a service technician/operator/user/customer to temporarily adjust the position of the cooling infrastructure in a controlled manner. Specifically, the device allows for controlled application of force between elements applying compressive forces to a particular memory module. This controlled application of force increases the gap between the particular elements. The reduced compressive load reduces the amount of force the service technician/operator must apply to extract the memory module as well reduce the potential for displacement of the thermal interface material due to friction between the thermal interface material and the memory module.

At some degree of adjustment of position for an embodiment, the compressive loads applied to the particular module are reduced. At another degree of adjustment for an embodiment, the increase in gap between the elements provides a nominal gap on at least one side of a memory module, between the module and the element on one side, if not both sides. In either case, whether merely reduced compressive load or provision of an actual nominal gap, the alleviation of the compressive forces removes or so greatly decreases the friction between the cooling elements and the particular memory module that the module may then be removed without having to remove any of the cooling infrastructure.

In embodiments, beyond being configured to controllably adjust the gap between the two cooling elements of a double-sided cooling system, the device is configured to be maintain the increased gap between the elements at their adjusted positions. In embodiments, the device is configured to retain itself in place and/or orientation with respect to the memory module, the cooling elements, the cooling system, and/or the computing system, when the elements are adjusted to the increased gap.

Upon completion of the service action and removal of the device proposed in this invention, the cooling infrastructure would return to its reference position. Therefore, in embodiments, the device comprises both a spreading device and a temporary spacer and/or the method comprises both steps for spreading elements and spacing elements. Further, in embodiments, the device is configured to controllably spread elements and temporarily space elements.

Referring now to FIG. 1, what is shown is a memory service device 1. In this perspective view, the device 1 is shown standing upright. The memory service device 1 comprises a handle 3, a table section 5, and a spreader section 7.

Referring now to FIG. 2A, what is shown is a memory service device 1 that is similar to that shown in FIG. 1. Here, the memory service device 1 is shown in a bottom perspective view. From this angle, it can be seen that the spreader section 7 comprises a spreader profile 9. The spreader profile 9 comprises a pair of curves 13 and 15 that are symmetric about a central axis 17 that extends through the center of the device 1, from the handle 3 through the table section 5, and through the end of the spreader section 7.

Referring now to FIG. 2B, what is shown is a memory service device 1 that is similar to that shown in FIGS. 1 and 2A. Here, the memory service device 1 is shown in a bottom view. In this view, there are two reference lines extending through the axis 17: an insertion angle line 19 and a stable gap line 21 (arranged at 90 degrees to the insertion angle line 19). In this view, the insertion angle line 19 is vertical, and the stable gap line 21 is horizontal.

Each of the spreader profile 9's curves 13 and 15 comprise 2 surfaces and a curved portion. Specifically, each of curves 13 and 15 comprise a first landing 27, a transition section 29, and a second landing 31. At this angle of view, with respect to the topmost curve 13, the first landing 27 extends from the leftmost edge of the spreader profile 9 to the insertion angle line 19. The second landing 31 extends upward from the bottommost edge of the spreader profile 9 to a retainment point 33 that is above the stable gap line 21. The profile 9 is characterized dimensionally by a first width 23 defined by the first landings 27 of each curve 13 and 15 (arranged parallel to the insertion angle line 19), and a larger second width 25 defined by the second landings 31 of each curve 13 and 15 (arranged parallel to the stable gap line 21).

The transition section 29 for curve 13 extends arcuately between the rightmost edge of the first landing 27 to the retainment point 33 above its second landing 31. Symmetrically, the transition section 29 for curve 15 extends arcuately between the leftmost edge of it first landing 27 to the retainment point 33 below its second landing 31.

Referring now to FIG. 3, what is shown is a bottom view of a memory service device 1, in relative position of adjusting the position of a pair of compressive cooling elements 35 and 37 of a memory module, in a double-sided memory module cooling system. Here, the device 1 can be seen in progression from a state of insertion into the cooling system, through to a state of maintaining the elements 35 and 37 at an increased stable gap.

At initial insertion of the spreader section 7 between the cooling elements 35, 37, the device 1 fits into the gap between the elements 35, 37 at a rotation angle that arranges the first width 23 of the spreader section 7 parallel to the distance across the gap.

After an initial nominal amount of rotation, the spreader section 7 comes into contact with both of the elements 35 and 37. Thereafter, with increasing increments of angular movement, the contact radius 39 (the distance between the axis 17 and either of the elements 35 or 37) progressively increases, and progressively increases the size of the gap (between the elements 35, 37). The progressive increase in radius 39 means that throughout the rotation, the force of the elements 35, 37 resisting deflection effects a progressive increase in the torque required to turn the device 1 angularly further about the axis 17.

The increasing resistance means that the motion of turning the device 1 does not judder or suddenly snap past an inflection point, which might dislodge the device 1, unevenly load the elements 35, 37, or cause a sharp increase in load on either or both of the elements 35, 37. The symmetric shape of the spreader section 7 also means that the device 1 remains centered in the gap as the device 1 rotates, with each of the curves 13, 15 of the spreader section 7 effecting half of the total increase in the gap, over the course of the rotation. This distributes the force concentration of separating the elements between the two elements 35, 37, and thereby minimizes the maximum level of stress that either element 35, 37 could experience.

As the device 1 approaches an angle of rotation approximately at the retainment point 33, the radius 39 between the central axis 17 of the spreader section 7 and the cooling elements 35, 37 very slightly decreases. Beyond this point, shown in FIG. 2B as slightly less than 90 degrees from the initial insertion angle, the radius 39 then approaches a new local minimum, arranged at 90 degrees from the initial insertion angle. Therefore, such a decrease in the angle of rotation means that over the small angle between the retainment point 33 and 90 degrees, the elements 35, 37 are alleviated of a slight amount of the load imposed while the radius 39 increased through the transition section 29, in exchange for a very slight decrease in the maximum gap attained between the elements 35, 37.

At 90 degrees of rotation from the insertion angle, the second width 25 is arranged parallel to the direction extending across the gap between the elements 35, 37. In this position, it can be seen that the rest of the curve 13 (to the right of the stable gap line 21) is flat. The second landing 31 extends from the rightmost edge, leftward, past the stable gap line 21, to the point at which radius 39 passed the retainment point 33.

With flat surfaces (second landing 31, FIG. 2A) extending over the marginal distances to either side of the stable gap line 21, marginal angular offsets to either side of the stable gap line 21 effect a symmetric increase in radius 39, corresponding to symmetric increases in load imposed upon the elements 35, 37 over those offsets. The reaction forces over these increments thereby effect a local minimum in reaction force when the device 1 is arranged with the spreader section 9 at 90 degrees to the insertion angle (at the stable gap line 21). Thereby, the device 1 is self-centered to the 90 degree offset. By self-centering to 90 degrees, the gap between the elements is thereby maintained at a distance equal to the second width 29.

Note that decreases in angle (toward the insertion angle) beyond the retainment point 33 allow a progressive decrease in load on the elements 35, 37, whereas incremental increase in angle from 90 degrees correspond to a sharply increasing radius 39 per increment of rotation. Conversely, this means that over-rotation beyond the 90 degree offset of the stable gap line 21 effects an exaggerated degree of returning-force behavior. Also, because decrease in angle effects progressive decrease in load and increase in angle effects progressive increase in load, a user manipulating the device 1 receives reliable force feedback from the handle 3, throughout the entire range of motion.

In accordance with embodiments, the invention provides a method of servicing a memory module that is being liquid-cooled on two sides. Referring now to FIG. 4, what is shown is a step of a method of insertion of a memory service device 1 into a gap between two compressive cooling elements 35, 37. Here, in this perspective view of the step, the device 1 is lowered toward the elements 35, 37, adjacent to a memory module 41, until the spreader section 7 descends into the gap to the point that the table section 5 comes to rest on top of the cooling elements 35, 37. The handle 3 is arranged parallel to the length of the cooling elements 35, 37, corresponding to the spreader section 7 being arranged to be inserted into the gap with its first width 23 arranged across the gap (See FIG. 3).

Referring now to FIG. 5, what is shown a memory service device 1 similar to the device shown in FIG. 4, following a step of insertion into a gap between a pair of compressive cooling elements 35, 37 of a double-sided memory module cooling system, showing the angular alignment of the device 1 relative to the elements 35, 37 of the cooling system.

In this plan view (as in FIG. 4), the handle 3 is arranged parallel to the length of the cooling elements 35, 37, corresponding to the spreader section 7 being arranged to be inserted into the gap with its first width 23 arranged across the gap (See FIG. 3).

Referring now to FIG. 6, what is shown is a step of temporarily adjusting the gap between a pair of compressive cooling elements 35, 37 of a double-sided memory module cooling system, using a memory service device 1 similar to the device shown in FIG. 4. In this plan view of the step, the device 1 rotates 90 degrees, to arrange the handle 3 perpendicular to the cooling elements 35, 37. The rotation forces the elements 35, 37 away from one another, increasing the distance across the gap between the elements 35, 37, and decreasing the compressive force of the elements 35, 37 on the memory module 41. Following this step, the device 1 is retained in place, and the gap remains at this increased gap distance by the shape of the profile (9, See FIGS. 2A-B, 3). of the spreader section 7 (not shown).

In accordance with embodiments, following the step shown in FIG. 6, is a step of removing and replacing the memory module 41 from the computing system, while the device is retained in this stable gap position (See FIG. 2B) and maintains an increased gap between the compressive elements 35 and 37. Thereafter, in embodiments of the invention is a step of rotating the memory service device 1 counterclockwise, to return the gap between the elements 35, 37 to the distance across the gap shown in FIG. 4, before the spreader section 7 was inserted into gap between the elements 35, 37.

Of further note is that the progressive nature of the increase in the radius 39, owing to the shape of the profile 9 of the spreading section 7 shown in FIGS. 2B, 3 allows for the device 1 to be useful to controllably adjust the gap between cooling elements that are of distinct gap size to that shown between elements 35 and 37 in FIGS. 3, 4, 5, and 6.

In any of the discussed fluid-cooling infrastructure contexts, solutions must consider the user's skill level, time, and access to tools. Memory modules in typical computing systems are expected to remain a FRU (field replaceable unit), at a minimum, and are frequently expected to meet the limitations of being a CRU (customer replaceable unit). This expectation has not weakened in recent years, irrespective of the greater complexity and space limitations of liquid cooling infrastructure, compared to prior air-cooling infrastructures.

In accordance with embodiments, one issue of serviceability addressed by the present invention alleviates the issue of adequate access to tools. For both a field technician and a customer, maintaining a large quantity of occasional-use tools that are dedicated to a narrow purpose is a significant obstacle to readily servicing memory modules in a fluid-cooled system. Servicing memory modules and other components of liquid-cooled computing systems typically require a great quantity of tools. A user cannot be expected to keep an inventory of rarely used tools, and a technician cannot be expected to carry every imaginable narrow-application tool for every service action. A large quantity can be too cumbersome or heavy or too difficult to keep organized for someone carrying tools to a repair or service site.

In accordance with embodiments, the invention further increases the serviceability of liquid-cooled memory-modules by being configured to reduce the number of tools needed for servicing liquid-cooled systems. One embodiment reduces the number of tools for servicing a cooling system comprising double-sided memory module liquid cooling infrastructure which contains memory modules of multiple thicknesses. Such a cooling system comprises compressive elements configured to provide compressive forces to both sides of each particular module, but the gaps between pairs of elements are spaced apart from one another at a gap size that is commensurately sized to the thickness of a particular memory module, and therefore both the minimum and increased gaps for distinct pairs of compressive elements may be dissimilar to others. A device provided for each size of gap would multiply the number of tools that would be necessary to perform a service action.

Rather than requiring distinct sizes of spreader sections (see FIGS. 2A-B, 3), though, the present invention's spreader section 7 comprises a profile 7 having a transition section 29 that affords rotation of the spreader section 7 with the ability to increase the radius (39, FIGS. 2B, 3) of a point of contact with compressive cooling elements (35, 37, FIGS. 3, 4-6) between two local minimum widths (first width 23, second width 25, FIG. 2B).

Operation of the device 1 varies the gap between cooling elements between a gap size corresponding to the thickness of a particular memory module up to a gap size which is somewhere within the range of maximum radii for radius 39, as measured between the axis 17 and any point on the profile 9 of the spreader section 7. So long as a memory module has a thickness which is at least as large as the first width 23, and which would be removable at an increased gap size which is within twice the maximum radius of 39 for a particular size of the device, the same embodiment can be used.

Where a particular memory module comprises a thickness such that it is provided with cooling elements which can be spaced to some significant degree of a nominal gap or reduced compressive force, even if not to a complete separation from the memory module, the present invention provides a controlled adjustment to increase the gap, as well as provide a user-toggled temporarily adjusted increased gap. Modules having a thickness larger than the first width 23 would simply require a larger initial angle of rotation of the device 1 (after insertion of the spreader section 7) before the spreader section begins its progressive spreading. See more about initial nominal amount of rotation with respect to FIG. 3. By its range of applicability through its entire range of radiuses, a single instance of the invention, though optimized for a particular gap size, is nonetheless configured to eliminate the need for a tool for each size of gap.

In another embodiment, the invention comprises a device 1 similar to that which appears in FIGS. 1-6 that alleviates the burden of a double-sided liquid-cooled memory module cooling system by mitigating an obstacle to maintaining an inventory. Referring now to FIGS. 1-6, the device 1 comprises a open channel extending from the bottom of the spreader section 7 up through the table section 5 and extending a significant distance into the handle 3. The cross section of the channel is approximately the size of the distance between the opposed faces of the handle 3, and thereby does not create openings in the profile 9 of the spreader section 7 and remains within the footprint of the handle 3 through the depth of the table section 5 until it reaches the top surface of the table section 5. Above the table section 5, the channel's width matches the width of the handle and opens the channel to both sides of the handle.

Such an embodiment is configured to receive a pin or detent or cord or hook or loop of pliant material (such as a string) in at least one of: into the channel from the bottom of the spreader section 7, extending to any particular distance, and/or catching on the periphery of an opening or both openings of the handle, from one side of the handle into the channel and/or through the end of the channel, and/or entering and passing through both openings in the handle 3.

One embodiment of the invention could have a flange or pin or depending tab or catch inside the interior of a housing for a computing system which uses a double-sided memory module cooling system. For such an embodiment, the device would simply be retained in its place of use and would not need its own place in an inventory.

What is claimed is:

1. A device comprising:
   a table section;
   a handle on a first side of the table section; and
   a spreader section on a second side of the table section opposite from the first side,
   a profile of the spreader section comprising:
   a first pair of a flat surfaces parallel to each other defining a first width;
   a second pair of flat surfaces parallel to each other defining a second width perpendicular to the first width, the second width being longer than the first width; and
   a pair of curved transition sections on opposite corners of the profile, each transition section configured to controlled adjustment with progressive incremental radius increments between adjacent surface from each of the first pair and second pair,
   such that the device is adapted to insertion with respect to a gap between cooling elements of a double-sided memory module cooling system and is configured to be rotated to adjust the position of the cooling elements.

2. The device of claim 1, wherein the spreader section is configured to expand the gap between the cooling elements of the double-sided memory module cooling system when rotated to adjust the position of the cooling elements.

3. The device of claim 2, wherein the spreader section is configured to expand the gap between the cooling elements without permanently damaging the cooling elements.

4. The device of claim 2, wherein the spreader section is configured to expand the gap between the cooling elements symmetrically about the spreader section.

5. The device of claim 1, wherein the first width is configured to be less than the gap between the cooling elements of the double-sided memory module cooling system.

6. The device of claim 1, wherein a width of the table section is configured to be wider than the gap between the cooling elements of the double-sided memory module cooling system.

7. The device of claim 1, further comprising a channel extending from an exterior surface of the spreader section, through the table section, and through at least a portion of the handle.

* * * * *